United States Patent
Goodell et al.

[19]

[11] Patent Number: 6,137,340
[45] Date of Patent: Oct. 24, 2000

[54] LOW VOLTAGE, HIGH SPEED MULTIPLEXER

[75] Inventors: Trenor F. Goodell, Peaks Island; Oscar W. Freitas, Cape Elizabeth, both of Me.

[73] Assignee: Fairchild Semiconductor Corp, South Portland, Me.

[21] Appl. No.: 09/132,594

[22] Filed: Aug. 11, 1998

[51] Int. Cl.[7] ................................................ H03K 17/62
[52] U.S. Cl. ........................... 327/407; 327/403; 330/51
[58] Field of Search ..................................... 327/403, 404, 327/405, 407, 408, 410, 411, 419, 427, 432, 434, 99; 330/295, 299, 300, 51, 147; 326/126, 124, 66

[56] References Cited

U.S. PATENT DOCUMENTS

| | | | |
|---|---|---|---|
| 3,639,781 | 2/1972 | Marley | 326/105 |
| 3,681,614 | 8/1972 | Kroos | 326/126 |
| 3,708,699 | 1/1973 | Frei et al. | 327/431 |
| 3,783,307 | 1/1974 | Breuer | 327/411 |
| 4,686,394 | 8/1987 | Lam | 326/126 |
| 4,686,674 | 8/1987 | Lam | 370/537 |
| 4,932,027 | 6/1990 | Scharrer | 376/540 |
| 4,963,767 | 10/1990 | Sinh | 326/126 |
| 4,987,578 | 1/1991 | Akins et al. | 375/377 |
| 5,075,566 | 12/1991 | Chuang et al. | 327/411 |
| 5,148,121 | 9/1992 | Uchida | 330/295 |
| 5,266,845 | 11/1993 | Sakaue | 326/21 |
| 5,278,465 | 1/1994 | Hamada | 326/43 |
| 5,298,810 | 3/1994 | Scott et al. | 326/66 |
| 5,406,133 | 4/1995 | Vora | 327/108 |
| 6,018,261 | 1/2000 | Alford et al. | 327/307 |

*Primary Examiner*—Timothy P. Callahan
*Assistant Examiner*—Minh Nguyen
*Attorney, Agent, or Firm*—Pierce Atwood; Chris A. Caseiro

[57] ABSTRACT

A multiplexer for selecting a single output signal from a plurality of input signals. For a plurality of complementary input signal pairs in particular, the multiplexer includes for each pair of complementary input signals a control sub-circuit having a selection switch and a common resistance in parallel. The switch and the common resistance have a common low-potential node that is tied to a pair of resistances that are in parallel, wherein each of the parallel resistances is coupled to the respective high-potential nodes of a differential amplifier. A particular pair of incoming complementary input signal pairs controls the differential amplifier. An off-circuit selection signal selects which switch of a plurality of control sub-circuits is activated. When a switch is on, it creates a bypassing of the common resistance, thereby enabling the turn-on of output drivers coupled to the differential amplifier. When a switch is off, the potential drops across the common resistance and the parallel resistances reduce the potential at the output drivers' control nodes enough to block their turn-on. As a result, the only output drivers providing signal output are those associated with the one selected control sub-circuit having its switch turned on.

14 Claims, 4 Drawing Sheets

LOW VOLTAGE, HIGH SPEED MULTIPLEXER

BACKGROUND OF THE INVENTION

1. Field of the Invention

The present invention relates to circuitry to aid in the routing of electrical signals from one location to another, such as from one semiconductor-based device to another. In particular, the present invention relates to the selection of particular electrical signals for transfer. More particularly, the present invention relates to multiplexers for selection/de-selection of electrical signals to be routed, including, but not limited to, emitter-coupled logic (ECL) signals.

2. Description of the Prior Art

Circuits designed to aid in the selection of one or more electrical signals for routing from one device to another are commonly referred to as multiplexer circuits. Multiplexing circuits generally include a plurality of gating mechanisms that permit one and only one signal from a plurality of incoming signals to pass through from one device to another. Those devices may be on the same chip (as in the case of a microprocessor) or on different chips (such as between a memory device and a microprocessor). In the case of ECL multiplexers in particular, the selected signal is actually a complementary pair of signals selected from a plurality of complementary input signal pairs.

The continuing interest in achieving faster processing rates in most electronic systems affects all components thereof, including ECL-based multiplexers. It is well known that bipolar-transistor-based ECL is one of the fastest logic families available. The difference in the potentials associated with an ECL high signal and an ECL low signal is generally on the order of 0.4V to 1.6V. That is, the peak-to-peak voltage differential (Vpp) between a logic high and a logic low may be as small as 0.4V.

One example of a high-speed ECL multiplexer operating generally under those potential swings is illustrated in FIG. 1. The prior-art multiplexer illustrated in that drawing includes an exemplar plurality of inputs including a first set of complementary inputs, input and input_bar and a second set of complementary inputs, input2 and input2_bar. A selection input select provides the control signal for defining which of the input pairs is to be selected by the multiplexer for delivery of a single complementary output signal pair designated by output and output_bar. The pathway for the first set of complementary inputs includes a first differential amplifier DA1, a first pass gate driver set PGD1, a first pass gate PG1, an output differential amplifier ODA, and output drivers Q52 and Q51 to buffer and shift the levels of outputs output and output_bar, respectively. The pathway for the second set of complementary inputs is similarly configured.

The first differential amplifier DA1 and the second differential amplifier DA2 each includes a pair of bipolar transistors, Q68, Q69 and Q76, Q77. Those differential transistors have their collector nodes coupled to the high-potential power rail Vcc, either directly, or through potential-setting resistances, shown in FIG. 1 as resistances R66, R67 and R70, R71. These resistances set the potential at the control nodes of the pass gate driver sets PGD1 and PGD2. The extra set of drivers provided by transistors Q51 and Q52 are required to increase the signals provided by the pass gate transistors as those MOS transistors must be relatively small in order to be fast, as is well known to those skilled in the art.

It can be seen in the operation of the multiplexer shown in FIG. 1 that the pass gate transistors charge up the control nodes of the transistors of the output differential amplifier ODA. That amplifier in turn regulates the operation of the output drivers Q51 and Q52. The required charging up of the capacitance associated with the transistors of that stage of the circuit could lead to undesirable transient signal noise.

The ECL multiplexer illustrated in FIG. 1 is less efficient in operation than is desirable and possible. That is, the delay associated with the signal transfer through the pass gates and the powering up of the transistor used to configure the output differential amplifier alone is on the order of 500 picoseconds. In order to advance the state of microprocessing, it would be advantageous to minimize delays without sacrificing performance.

Therefore, what is needed is a multiplexer that may be incorporated into any logic operation system and that provides faster switching times than presently available. What is also needed is such a multiplexer that is substantially limitless in regard to the number of inputs to be multiplexed, and that provides for satisfactory signal transfer with, to the extent possible, minimal switching noise.

SUMMARY OF THE INVENTION

It is an object of the present invention to provide a multiplexer capable of handling ECL and other types of signal swings. It is also an object of the present invention to provide a multiplexer capable of handling a large number of input signal pairs for suitable transfer of a single output signal set. Another object of the present invention is to provide a multiplexer that provides for satisfactory signal transfer, including minimizing switching noise as possible. A further object of the invention is to increase signal propagation rate.

These and other objectives are achieved in the present invention by eliminating the pass gate drivers and pass gates from the prior-art circuit of FIG. 1. The present invention is a multiplexer that includes for each input signal pair a control sub-circuit formed of an amplifier, a switch, and a pair of signal drivers coupled to the output node pair. The amplifier is preferably a differential amplifier that may be used for selectable signal pairs as well as singled-ended signals. As previously noted, the output drivers of the prior-art design had been coupled to the pass gate sets and required charging up therethrough. In the present invention, the high-potential nodes of the output drivers are coupled to both the high-potential power rail and a pseudo-high-potential. It is the regulation of the pseudo-rail that defines which of the sets of output drivers is selected for transmission of the complementary output signal pair.

The pseudo-rail is developed through the switch, which is preferably an active device, such as a transistor. The switch includes a control node coupled to the selection input used to define which of a plurality of input pair signals is to be selected for output. Select logic is coupled to the plurality of switches and is designed to ensure that one and only one switch is activated in compliance with the selection command. Each control sub-circuit includes a first high-potential branch and a second high-potential branch. The first branch is coupled between the high-potential rail and the high-potential node of the first transistor of the differential amplifier of that sub-circuit. The second branch is coupled between the high-potential rail and the high-potential node of the second transistor of that sub-circuit's differential amplifier. The control node of the first output driver is coupled to the first branch and the control node of the second output driver is coupled to the second branch. The first and second branches each include a passive or active impedance element that is capable of providing a well-defined potential drop.

The resistance elements of the two branches have a common high-potential node coupled to the high-potential rail through a potential-drop device, such as a common resistance element, and through the switch that is in parallel with the common resistance element. The common resistance element may be, but is not limited to, a resistor, a diode, or a diode-connected transistor. The common resistance element must provide a potential drop that is greater than the Vpp corresponding to the potential differential between high and low logic signals. That is, for ECL logic for example, the potential drop across the common resistance element may be as low as slightly more than 0.4V and has high as slightly more than 1.6V, based on the ranges earlier noted. This is necessary to ensure that a signal driver of a deselected signal will not turn on unexpectedly.

An independent current source is preferably coupled between the common low-potential node of the differential amplifier transistor pair for each control subcircuit. This current source defines the current passing through both branches of the sub-circuit, as is well known in the design of ECL circuitry. Although the present invention is applicable to various amplifier configurations, including differential amplifiers in particular, it is preferably directed to ECL differential amplifiers.

In operation, when a control sub-circuit's switch is off pursuant to a particular selection signal, current passes through both branches by way of the common resistance element. Because of the potential drop associated with each resistance element there is insufficient potential to turn on either of those drivers. That is, there are two drops associated with each branch when the switch is off. However, that combination of drops is only just enough to keep those drivers off. That is, each of the output drivers is just suppressed from activation, and would require essentially no charging up to become operational. When the switch is turned on, the common resistance element is bypassed and there is only either the first branch resistance or the second branch resistance that drops the potential at the respective driver's control node. In effect, the low-potential node of the switch becomes the pseudo-high-potential rail. The drop from the potential of Vcc to the control node of the driver is only equivalent to that one resistance drop. The potential at the control nodes of the drivers of a selected sub-circuit of the multiplexer is then enough to turn them on. However, since they are already substantially charged when that occurs, there is very little transient noise associated with their turn-on. The particular output driver that defines the equivalent of a logic high signal and which defines the equivalent of a logic low signal at output and output_bar is then simply dependent upon the complementary inputs to the differential amplifier of that particular selected control sub-circuit. Of course, if the multiplexer is used to select a single signal rather than a signal pair, a simple driver amplifier rather than a differential driver may be used. Alternatively, differential amplifiers may be employed with each sharing a common potential input node, or each having individual constant potential references.

In summary, the present invention is a multiplexer that provides for each input signal pair a pseudo-high-potential rail coupled to the high-potential nodes of a common-low-potential-node differential amplifier. The particular pseudo-rail that is selected provides a potential at the high-potential nodes of the differential amplifier that is higher than that provided at all other deselected differential amplifiers of the multiplexer. The output drivers coupled to the selected differential amplifier are thereby turned on, while the output drivers coupled to deselected amplifiers are not sufficiently forward-biased to turn them on. The preferential use of bipolar transistors rather than MOS transistors in the signal path aids in maximizing propagation speed. Another advantage of the present invention is the use of fewer active elements than are used in the prior-art design, thereby aiding propagation speed. The result is faster output of the selected signal than was available in the prior art. It is to be noted that the configuration of the multiplexer of the present invention may be implemented using MOS, bipolar, and BiCMOS transistor circuitry. The present invention further provides for low stacking requirements, which in turn makes low-voltage operation possible. The present invention is simpler than the prior-art multiplexer in that it reduces the number of active components previously used to perform the same function. This makes fabrication easier and causes a reduction in signal transmission delay, thereby making the circuitry faster than the prior art. Finally, noise improvement may be possible under certain operating conditions in that the output drivers are always biased to a non-zero potential; that is, near the operating point.

These and other advantages of the present invention will become apparent upon review of the following detailed description, the accompanying drawings, and the appended claims.

DESCRIPTION OF THE PREFERRED EMBODIMENT OF THE INVENTION

Figure 2:
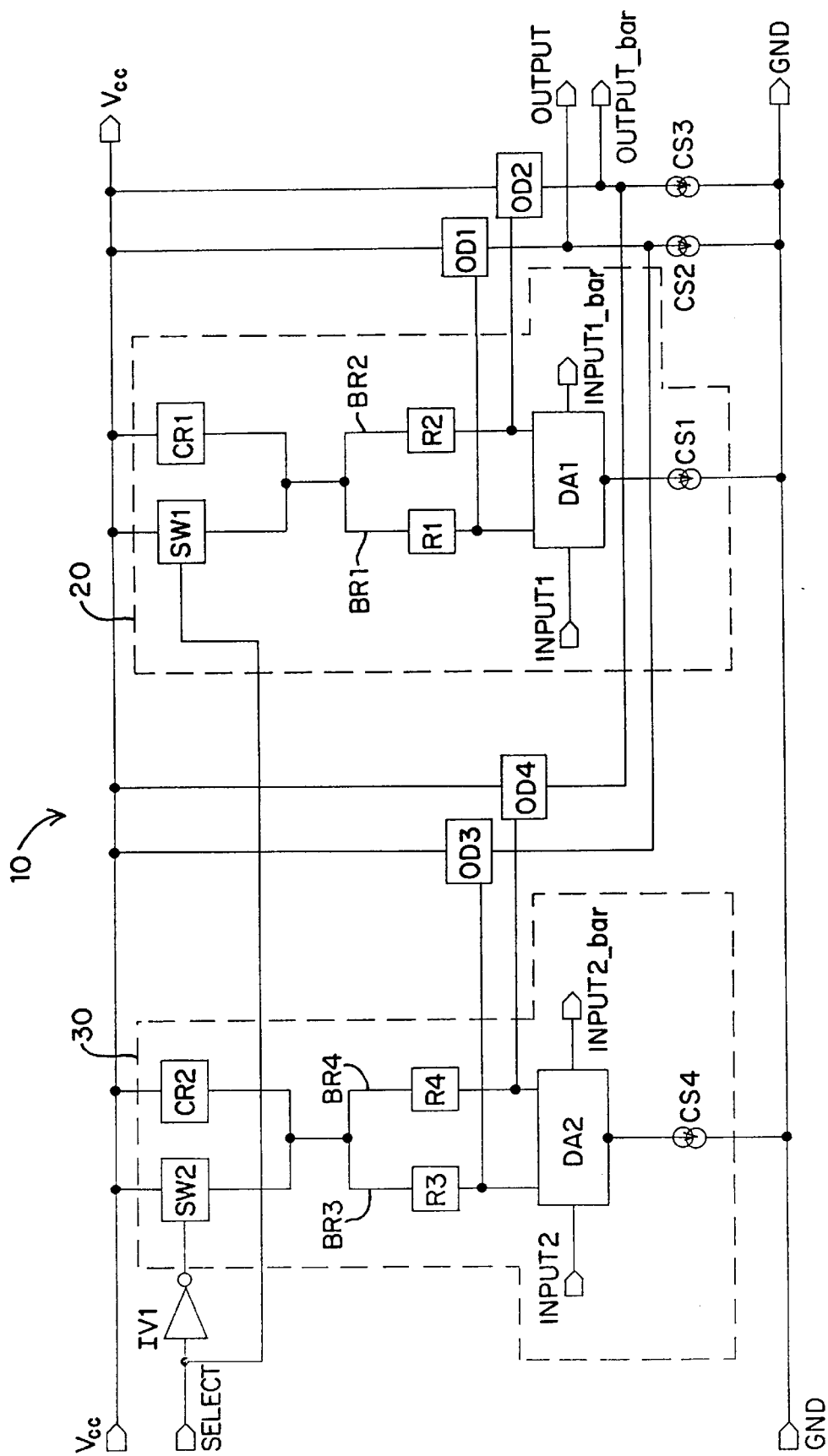
FIG. 2 is a simplified block diagram of the multiplexer of the present invention.

A multiplexer 10 of the present invention is shown in simplified form in FIG.2. The multiplexer 10 includes a plurality of control sub-circuits corresponding in number to the number of pairs of input signal pairs to be selected by the multiplexer 10 for output at the complementary output nodes output and output_bar. For illustrative purposes, only two control sub-circuits, identified as sub-circuits 20 and 30, are shown in FIG. 2. However, it is to be understood that many more control sub-circuits may be employed as part of the multiplexer 10.

Control sub-circuit 20 includes a switch SW1, a common impedance element that is designated as a common resistance element CR1, a first resistance branch BR1 having first resistance element R1, a second resistance branch BR2 having second resistance element R2, and a differential amplifier DA1. Switch SW1 and common resistance element CR1 are each coupled directly to high-potential power rail Vcc. Switch SW1 may be any active element, such as a MOS transistor or a bipolar transistor. The differential amplifier DA1 is preferably formed of a pair of opposing transistors having a common low-potential node, which common node is coupled to low-potential power rail GND through a first stable current source CS1. A pair of input nodes identified as input1 and input1_bar provides the selectable complementary input signals used to generate the complementary output signals at output and output_bar. It is to be noted that for selection and output of a single signal rather than a complementary signal pair, either of the differential amplifier inputs may be coupled to a potential common to the equivalent input of any of the other differential amplifiers of the multiplexer 10. Further, the selectable single-ended input signals may be coupled to simple amplifiers rather than differential amplifiers.

The high-potential nodes of the transistors of the differential amplifier DA1 are coupled to a first output driver OD1 and a second output driver OD2 such that those drivers produce the desired output from the multiplexer 10. Current through the drivers is defined by independent current sources CS2 and CS3, respectively. The drivers OD1 and OD2 are turned on and off as a function of the potential at the low-potential nodes of resistances R1 and R2. This potential is in turn regulated by the operation of switch SW1. Specifically, when switch SW1 is selected by control means through selection node select to be on, the potential at the control node of driver OD1 is equivalent to Vcc minus the drop across resistance element R1. Similarly, the potential at the control node of OD2 is equivalent to Vcc minus the potential associated with the resistance of R2. It is important to note, however, that only one of the drivers of a selected branch represents a logic high at any one time, as a function of DA1. The currents through the transistors of amplifier DA1, set by the inputs input1 and input1_bar define which of the two drivers delivers a high-potential signal to the respective output nodes. When switch SW1 is not selected, it is off and the equivalent drop reduces the potential at the nodes of drivers OD1 and OD2 further across common resistance CR1. The resistances of CR1, R1, and R2 are selectable so as to ensure that drivers OD1 and OD2 cannot be turned on when switch SW1 is off. However, as earlier stated, the resistance of CR1 must be at least slightly greater than the differential associated with Vpp of the particular signals being multiplexed.

Control sub-circuit 30 is similarly configured. It includes switch SW2, common resistance CR2, third resistance branch BR3 including third resistance element R3, fourth resistance branch BR4 including fourth resistance element R4, second differential amplifier DA2, and fourth current source CS4. A pair of input nodes identified as input2 and input2_bar provide the selectable complementary input signals used to generate the complementary output signals at output and output_bar when control sub-circuit 30 is selected via the turning on of switch SW2. The high-potential nodes of the transistors of the differential amplifier DA2 are coupled to a third output driver OD3 and a fourth output driver OD4 such that those drivers produce the desired output from the multiplexer 10 when sub-circuit 30 is selected for operation. Control logic such as inverter IV1 ensures that switch SW2 does not receive the same select signal provided to switch SW1. In all other respects, sub-circuit 30 operates in the same manner as that described for sub-circuit 20.

The general description of the multiplexer 10 with reference to FIG. 2 illustrates the novel aspects of the invention with regard to the introduction of a pseudo-high-potential rail for drivers OD1 to OD4. The pseudo-rails that are generated for each of the control sub-circuits are developed by way of the turning on of the respective switches of particular sub-circuits. The triggering of one and only one pseudo-rail of the multiplexer 10 ensures that one and only one input signal pair is selected for output. This is achieved in the present invention at faster propagation rates and with less noise problems than associated with prior multiplexers. The present invention may employ MOS, bipolar, or BiCMOS transistor configurations for active elements. Resistive elements CR1 and CR2 of the invention shown in FIG. 2 may include resistors, diodes, and diode-connected transistors.

Figure 3:
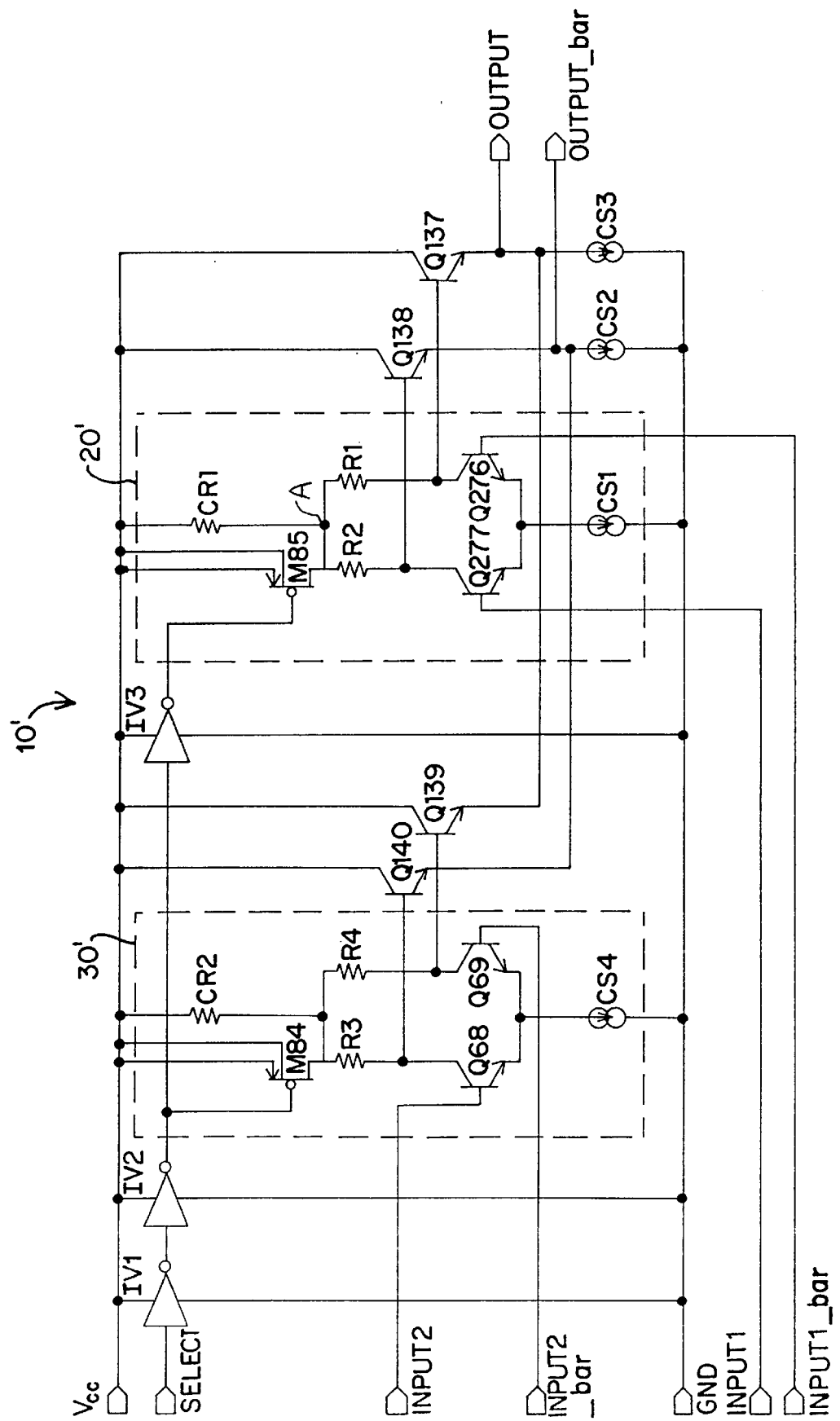
FIG. 3 is a simplified schematic diagram of the multiplexer of the present invention.

A detailed design of preferred high-speed, low-voltage multiplexer 10' of the present invention is shown in FIG. 3. The multiplexer 10' includes a first control sub-circuit 20' and a second control sub-circuit 30'. First sub-circuit 20' includes MOS transistor switch M85 having its source and bulk coupled to Vcc, its drain coupled to resistors R1 and R2 at node A, and its gate coupled to selection node select by way of inverters IV1–IV3. Sub-circuit 20' further includes common resistor CR1 coupled between Vcc and node A. A first differential amplifier formed of common-emitter bipolar transistors Q276 and Q277 is coupled to low-potential rail GND through the common emitter by way of independent current source CS1. The collector of transistor Q276 is coupled to node A by way of resistor R1 and the collector of Q277 is coupled to node A through resistor R2. Input input1 controls the base of transistor Q277 while input input1$_{13}$ bar controls the base of transistor Q276. The collector of Q277 is coupled to the base of a first output driver emitter-follower transistor Q138 and the collector of Q276 is coupled to the base of second output driver emitter-follower transistor Q137. The collectors of Q137 and Q138 are preferably tied directly to Vcc. The emitter of Q137 is coupled to GND through second independent current source CS3, while the emitter of Q138 is coupled to GND through third independent current source CS2. The complementary output signals to be transferred by the multiplexer 10' are delivered by way of output nodes output and output_bar. Output is coupled to the emitter of transistor Q137 while output_bar is coupled to the emitter of transistor Q138, each in an emitter-follower configuration.

Sub-circuit 30' is similarly designed. Sub-circuit 20' includes MOS transistor switch M84 having its source and bulk coupled to Vcc, its drain coupled to resistors R3 and R4 at node B and its gate coupled to selection node select by way of inverters IV1 and IV2. Sub-circuit 30' further includes common resistor CR2 coupled between Vcc and node B. A first differential amplifier formed of common-emitter bipolar transistors Q68 and Q69 is coupled to low-potential rail GND through the common emitter by way of independent current source CS4. The collector of transistor Q68 is coupled to node B by way of resistor R3 and the collector of Q69 is coupled to node B through resistor R4. Input input2 controls the base of transistor Q68 while input input2$_{13}$ bar controls the base of transistor Q69. The collector of Q69 is coupled to the base of a third output driver emitter-follower transistor Q139 and the collector of Q68 is coupled to the base of fourth output driver emitter-follower transistor Q140. The collectors of Q139 and Q140 are preferably tied directly to Vcc. The emitter of Q139 is coupled to GND through CS3, while the emitter of Q140 is coupled to GND through CS2. Output is coupled to the emitter of transistor Q139 while output_bar is coupled to the emitter of transistor Q140.

It is to be understood that all of independent current sources CS1–CS4 may be developed in any number of well-known ways, including, but not limited to, the use of a bipolar transistor in series with a tail resistor, wherein the transistor is independently controlled by a temperature-compensated controller.

In operation, a logic high at select turns on M85 and ensures that M84 is off. The potential at the bases of transistors Q137 and Q138 is about at Vcc potential minus the drop across resistors R1 and R2 respectively. As can be seen from the drawings, transistors Q137 and Q138 are emitter followers. Thus, with input1 high (and therefore low at input1$_{13}$ bar) node output_bar will be at a potential equivalent to Vcc minus the drop across switch M85 minus the drop across R2 minus the Vbe drop across Q138, resulting in a logic low corresponding to the logic low at input1_bar. At the same time, transistor Q137 will conduct and the potential at node output will be at Vcc less the relatively insubstantial drop across Q137 less the Vbe drop, resulting in a logic high output.

While sub-circuit 20' is operating pursuant to the logic high at select, sub-circuit 30' does not provide enough base drive potential to output transistors Q139 and Q140 for the reasons stated in regard to the discussion of FIG. 2. However, when select switches to a logic low, transistor M84 conducts and transistor M85 is turned off. Sub-circuit 30' therefore becomes the selected controller and the signals from inputs input2 and input2_bar are outputted to nodes output and output_bar, respectively.

Figure 1:
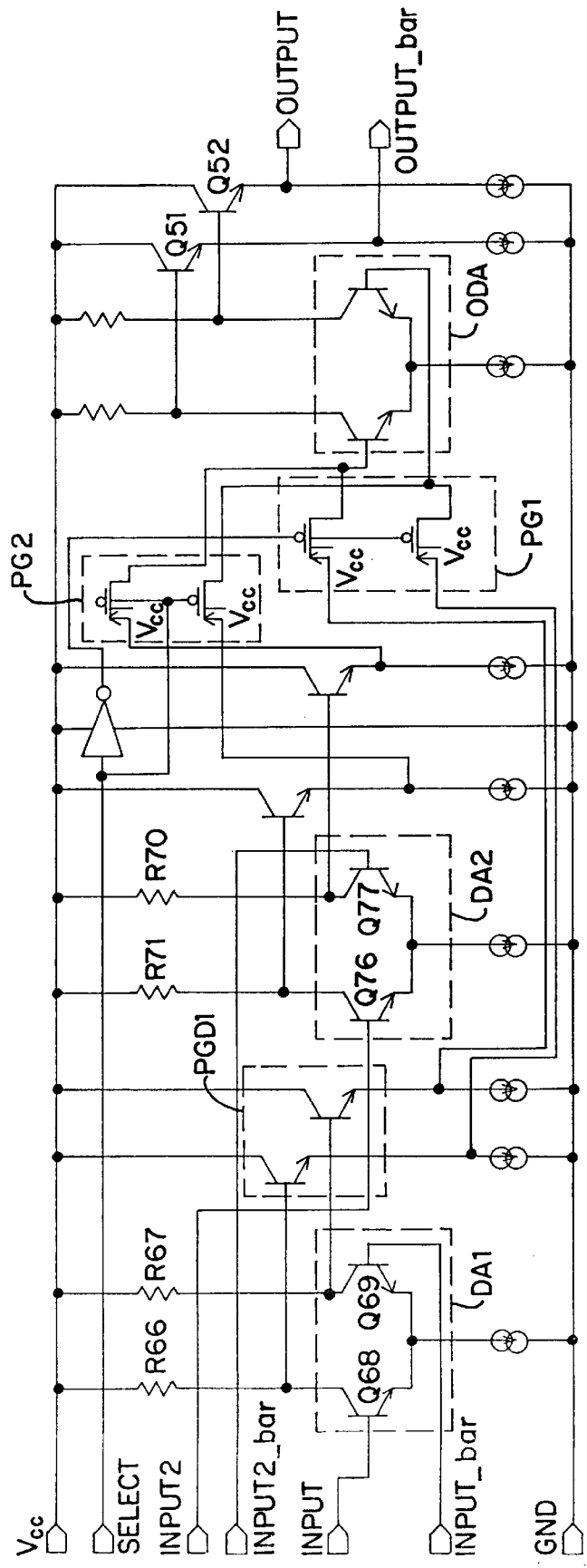
FIG. 1 is a simplified schematic diagram of a prior-art multiplexer.
Figure 4:
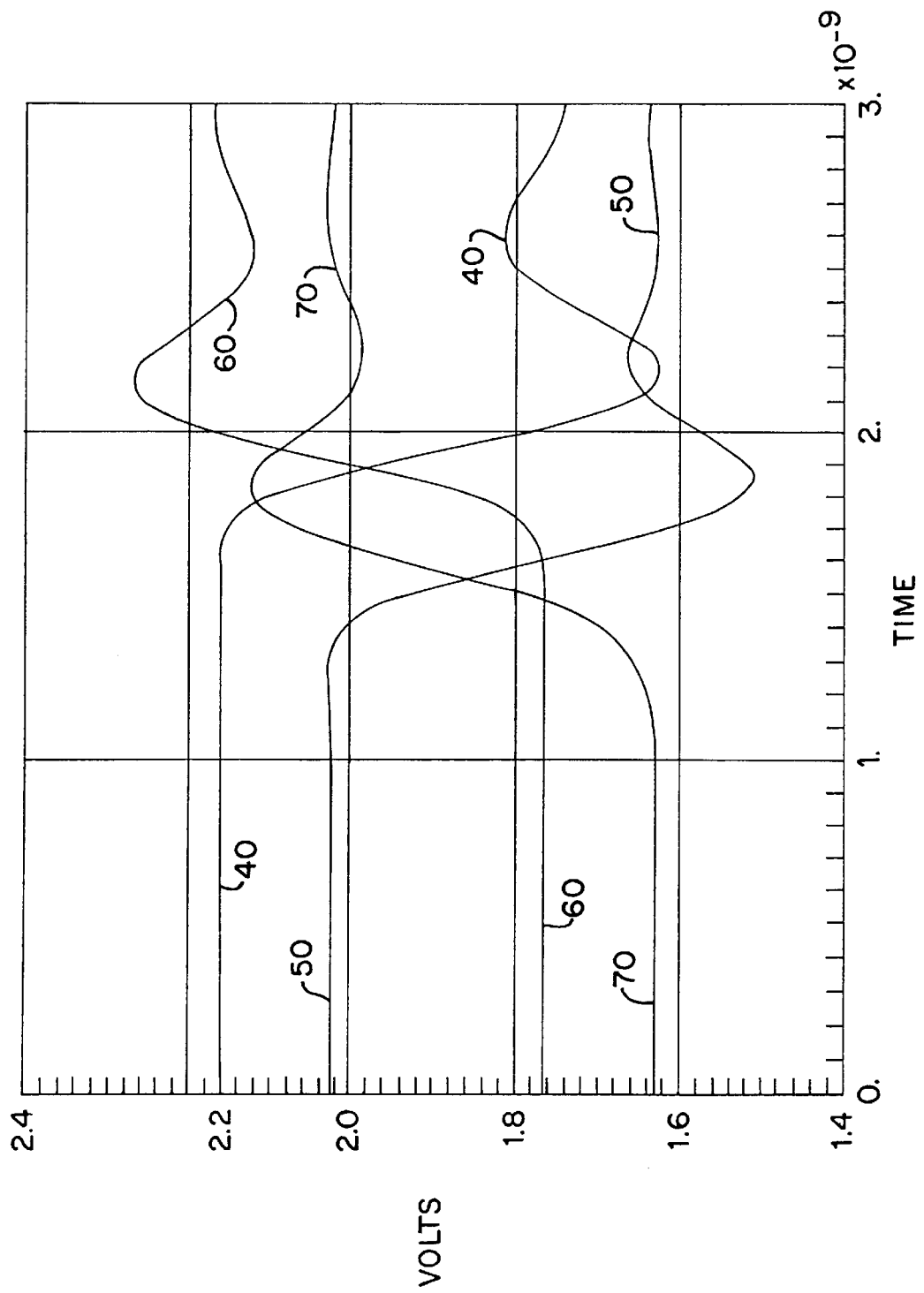
FIG. 4 is a waveform illustrating the improved delay features of the multiplexer of the present invention as compared to the prior-art multiplexer shown in FIG. 1.

FIG. 4 provides an illustration of the improvement in the delay associated with the operation of the multiplexer 10' shown in FIG. 3 in comparison to the prior-art multiplexer of FIG. 1. Specifically, line 40 shows a signal switch from high to low produced at output by the prior-art multiplexer. Line 50 shows a signal switch from high to low produced at output by the multiplexer 10'. Line 60 shows the transition of the prior-art output from a low to a high. Line 70 illustrates a signal switch from low to high produced at output by the multiplexer 10'. The crossover point in the signal transitions for the prior-art multiplexer is reached approximately 350 picoseconds later than the crossover point in the signal transition for the multiplexer 10'. For ECL signals it is that crossover point that is used as the reference to define signal propagation comparisons. Clearly, the present invention provides for faster signal propagation. The waveforms of FIG. 4 also illustrate that the noise associated with the multiplexer 10' is less than that associated with the prior-art multiplexer, as can be seen by the smoothness of the transition to steady state conditions during high-to-low and low-to-high transitions.

While the invention has been described with reference to particular example embodiments, it is intended to cover all modifications and equivalents within the scope of the following claims.

We claim:

1. A multiplexer circuit for selecting from a plurality of complementary input signal pairs a single complementary input signal pair for transmission of a single complementary output signal pair through a first multiplexer output node and a second multiplexer output node, the circuit comprising for each of the complementary input signal pairs:

a. a differential amplifier including a first input and a second input, a first high-potential node and a second high-potential node, and a common low-potential node, wherein said first high-potential node is coupled to the first multiplexer output node and said second high-potential node is coupled to the second multiplexer output node;

b. a first branch having a low-potential node coupled to said first high-potential node of said differential amplifier, said first branch including a first resistance element;

c. a second branch having a low-potential node coupled to said second high-potential node of said differential amplifier, said second branch including a second resistance element, wherein said first branch and said second branch have a common high-potential node;

d. a switch coupled between a high-potential power rail and said common high-potential node of said first branch and said second branch; and e. a common resistance element coupled between said high-potential power rail and said common high-potential node of said first branch and said second branch.

2. The circuit as claimed in claim 1 wherein said first high-potential node of said differential amplifier is coupled to the first multiplexer output node through a first output driver, and wherein said second high-potential node of said differential amplifier is coupled to said second multiplexer output node through a second output driver.

3. The circuit as claimed in claim 1 wherein said common resistance element is a resistor having a voltage drop across it slightly greater than a peak-to-peak voltage associated with a logic high and a logic low differential.

4. The circuit as claimed in claim 1 wherein said common resistance element is a diode.

5. The circuit as claimed in claim 1 wherein said switch is a P-type MOS transistor having a source coupled to said high-potential power rail, a drain coupled to said common high-potential node, and a gate coupled to an input signal selector control node.

6. The circuit as claimed in claim 1 wherein said switch is a bipolar transistor having a collector coupled to said high-potential power rail, an emitter coupled to said common high-potential node, and a base coupled to an input signal selector control node.

7. The circuit as claimed in claim 1 wherein said differential amplifier includes a first bipolar transistor having its collector coupled to said low-potential node of said first resistance element, and a second bipolar transistor having its collector coupled to said low-potential node of said second resistance element.

8. The circuit as claimed in claim 7 wherein said switch is a MOS transistor.

9. The circuit as claimed in claim 8 further comprising a third bipolar transistor coupled between said collector of said first bipolar transistor of said differential amplifier and said first multiplexer output node, and a fourth bipolar transistor coupled between said collector of said second bipolar transistor of said differential amplifier and said second multiplexer output node.

10. A multiplexer circuit for selecting from a plurality of complementary input signal pairs a single complementary input signal pair for transmission of a single complementary output signal pair through a first multiplexer output node and a second multiplexer output node, the circuit comprising for each of the complementary input signal pairs:

a. a differential amplifier including a first bipolar transistor coupled to a first input and a second bipolar transistor coupled to a second input, wherein said first bipolar transistor and said second bipolar transistor share a common emitter, and wherein a collector of said first transistor is coupled through a first output driver bipolar transistor to the first multiplexer output node and a collector of said second transistor is coupled through a second output driver bipolar transistor to the second multiplexer output node;

b. a first resistor having a low-potential node coupled to said collector of said first transistor;

c. a second resistor having a low-potential node coupled to said collector of said second transistor, wherein said first resistor and said second resistor share a common high-potential node;

d. a MOS transistor switch coupled between a high-potential power rail and said common high-potential node of said first resistor and said second resistor; and e. a common resistor coupled between said high-potential power rail and said common high-potential node of said first resistor and said second resistor.

11. A multiplexer circuit for selecting from a plurality of input signals a single input signal for transmission of a single output signal through a multiplexer output node, the circuit comprising for each of the input signals:
   a. a differential amplifier including an input and a high-potential node, wherein said high-potential node is coupled to the multiplexer output node;
   b. a resistance element having a high-potential node coupled to a high-potential power rail and a low-potential node coupled to said high-potential node of said differential amplifier; and
   c. a switch having a high-potential node coupled to said high-potential power rail and a low-potential node coupled to said low-potential node of said resistance element.

12. The circuit as claimed in claim 11 wherein said switch is a P-type MOS transistor having a gate coupled to a signal selector control node.

13. The circuit as claimed in claim 11 wherein said switch is a bipolar transistor having a base coupled to a signal selector control node.

14. A multiplexer circuit for selecting from a plurality of input signals a single input signal for transmission of a single output signal through a multiplexer output node, the circuit comprising for each of the input signals:
   a. a differential amplifier including an input and a high-potential node, wherein said high-potential node is coupled to the multiplexer output node;
   b. a common resistance element having a low-potential node coupled to said high-potential node of said differential amplifier and a high-potential node coupled to a high-potential power rail; and
   c. a MOS transistor switch having a source coupled to said high-potential power rail, a drain coupled to said low-potential node of said common resistance element, and a gate coupled to a logic controller.

* * * * *